United States Patent
Holl et al.

(10) Patent No.: US 9,662,983 B2
(45) Date of Patent: May 30, 2017

(54) DEVICE WITH MOVABLE CONTROL ELEMENT

(71) Applicant: DELPHI TECHNOLOGIES, INC., Troy, MI (US)

(72) Inventors: Jean Sebastien Holl, Chatenois (FR); Anthony La Paglia, Illkirch (FR); Maxime Rassent, Strasbourg (FR)

(73) Assignee: Delphi Technologies, Inc., Troy, MI (US)

( * ) Notice: Subject to any disclaimer, the term of this patent is extended or adjusted under 35 U.S.C. 154(b) by 232 days.

(21) Appl. No.: 14/420,696

(22) PCT Filed: Aug. 27, 2013

(86) PCT No.: PCT/EP2013/067720
§ 371 (c)(1),
(2) Date: Feb. 10, 2015

(87) PCT Pub. No.: WO2014/037248
PCT Pub. Date: Mar. 13, 2014

(65) Prior Publication Data
US 2015/0231969 A1      Aug. 20, 2015

(30) Foreign Application Priority Data

Sep. 5, 2012   (FR) ..................... 12 58279

(51) Int. Cl.
*G06F 3/033*   (2013.01)
*G11B 5/008*   (2006.01)
(Continued)

(52) U.S. Cl.
CPC ........... *B60K 37/06* (2013.01); *G01D 5/3473* (2013.01); *G06F 3/0308* (2013.01);
(Continued)

(58) Field of Classification Search
CPC .............. B60K 37/06; B60K 2350/102; B60K 2350/1048; B60K 2350/1004;
(Continued)

(56) References Cited

U.S. PATENT DOCUMENTS

| | | | | |
|---|---|---|---|---|
| 6,670,874 B1 * | 12/2003 | Galli | ...................... | H01H 36/00 335/205 |
| 2005/0162389 A1 * | 7/2005 | Obermeyer | ............ | G05G 9/047 345/161 |

(Continued)

FOREIGN PATENT DOCUMENTS

FR              2 590 100 A1    5/1987

OTHER PUBLICATIONS

International Search Report dated Oct. 29, 2013.

*Primary Examiner* — Amit Chatly
(74) *Attorney, Agent, or Firm* — Lawrence D. Hazelton

(57) ABSTRACT

The invention is a control device intended for the choice and the selection of functions in a vehicle. The device comprises three binary active sensors, arranged on an electronic board fixed in a case, the sensors switch on the passage of passive markers arranged on a support displaceable by means of a manipulable control element. The support being displaceable in translation along a first longitudinal main axis towards a front position and a rear position and perpendicularly along a second transversal main axis towards a right position and a left position, and in rotation about a normal axis perpendicular to the main axes in the clockwise direction and in the anticlockwise direction. The marker support and the control element are moreover connected to an indexing and return means which biases them permanently towards a neutral position.

7 Claims, 4 Drawing Sheets

(51) Int. Cl.
*B60K 37/06* (2006.01)
*G01D 5/347* (2006.01)
*G06F 3/0338* (2013.01)
*G06F 3/0362* (2013.01)
*G06F 3/03* (2006.01)

(52) U.S. Cl.
CPC .......... *G06F 3/0338* (2013.01); *G06F 3/0362* (2013.01); *B60K 2350/102* (2013.01); *B60K 2350/1004* (2013.01); *B60K 2350/1048* (2013.01); *H03K 2217/94063* (2013.01)

(58) Field of Classification Search
CPC .... G06F 3/0338; G06F 3/0308; G06F 3/0362; G01D 5/3473; H03K 2217/94063
USPC ................................................. 345/156–179
See application file for complete search history.

(56) References Cited

U.S. PATENT DOCUMENTS

2006/0012584 A1* 1/2006 Vassallo .................. G06F 3/016
345/184
2006/0227454 A1* 10/2006 Ruettiger ................ G05G 1/02
360/97.11

* cited by examiner

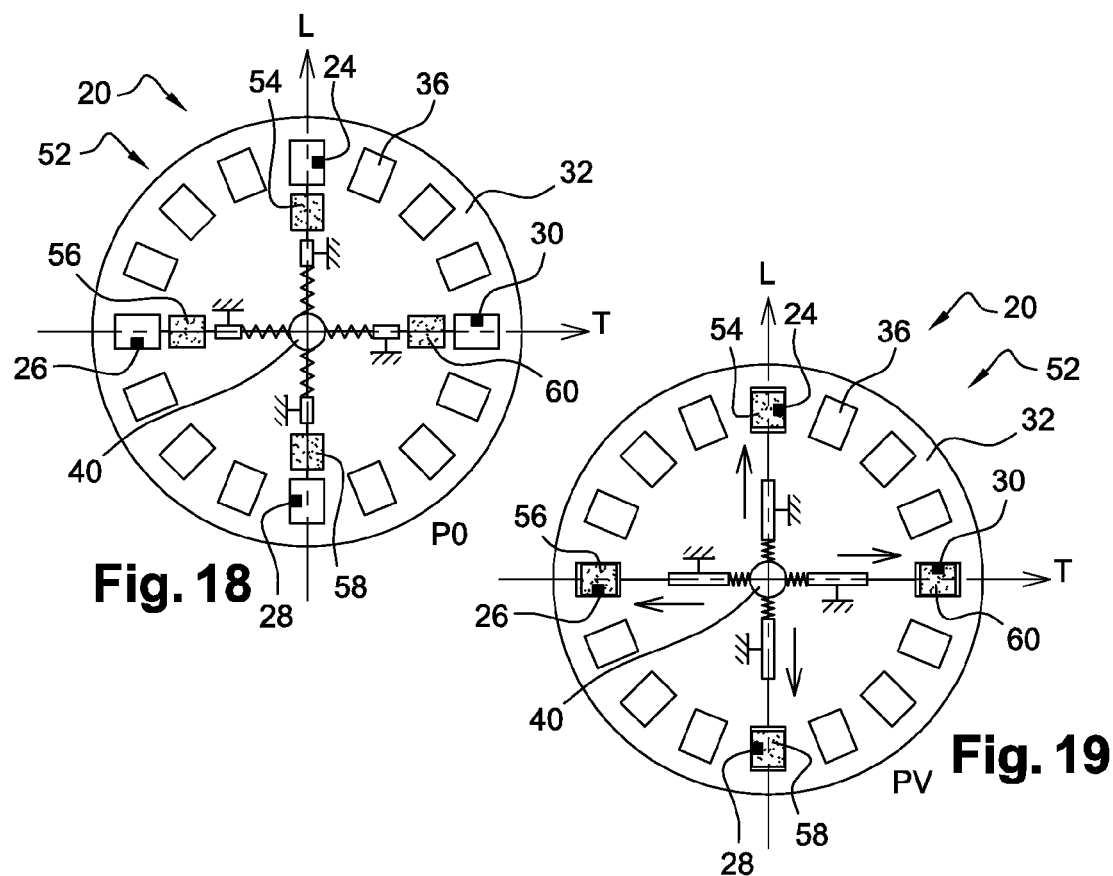
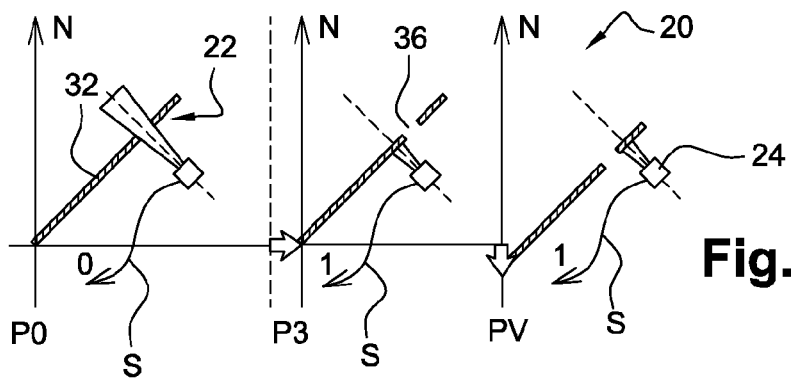
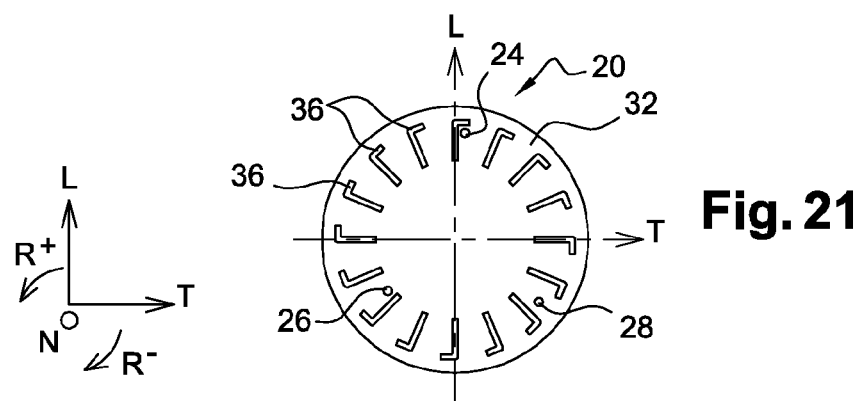

DEVICE WITH MOVABLE CONTROL ELEMENT

CROSS-REFERENCE TO RELATED APPLICATION

This application claims the benefit under 35 U.S.C. §371 of published PCT Patent Application Number PCT/EP 2011/054524, filed Mar. 24, 2011, claiming priority to French patent application number FR1052758 filed on 12 Apr. 2010, and published as WO2011/128196 on Oct. 20, 2011, the entire contents of which is hereby incorporated by reference herein.

TECHNICAL FIELD OF INVENTION

The present invention relates to a control device provided with a movable element the displacements of which are identified by a detector with binary sensors.

BACKGROUND OF INVENTION

Devices are known with an orientatable control element installed in vehicles and able to be manipulated by the driver who must however remain concentrated on his driving. These devices are generally connected to a display and the user must displace the control element in order to displace a cursor in a menu or to scroll through commands. From a stable neutral position, the control element is displaceable towards the front, the rear, towards the right or towards the left. The control elements can moreover be turned about a normal axis. Sometimes, they can also be displaceable slantwise, between the front, right, rear and left positions. Once the required command is reached, it can be validated by a simple pressure on the control element which is displaced in the manner of a computer keyboard key.

The user not looking at the control element, it is of primary importance that without any manipulation the control element is maintained in the neutral position in stable manner. It is also important that the displacements require slight forces. The rotations for their part are generally accompanied by a small cyclic force. To these forces created solely to contribute comfort and precision are added the forces necessary to switch sensors or micro-switches. The addition of voluntary forces and necessary forces is not exempt from undesirable changes.

Moreover, the displacements towards the front, the rear, the right or the left are generally the result of small rotations. It appears that true translations are better perceived by the user.

SUMMARY OF THE INVENTION

The present invention is intended to remedy the disadvantages mentioned above by proposing a simple and economical solution. To this end, the invention proposes a control device intended for the choice and the selection of functions in a vehicle. The device comprises three binary active sensors, arranged on an electronic board fixed in a case, the sensors switching on the passage of passive markers arranged on a support which can be displaced by means of a manipulable control element. The support is displaceable in translation along a first longitudinal main axis towards a front position and a rear position and perpendicularly along a second transversal main axis towards a right position and a left position. The support is also displaceable in rotation about a normal axis perpendicular to the main axes in the clockwise direction and in the anticlockwise direction.

The marker support and the control element are moreover connected to an indexing and return means which permanently biases them towards a neutral position.

The sensors and the markers being so arranged the ones relatively to the others that each of the five positions, neutral, front, rear, right, left as well as each of the two clockwise and anticlockwise rotations is individually identified by a three-digit binary signature emitted by the sensors.

This arrangement allows true translations of the control element but it can however be adapted to devices of which the control element is displaced in small rotations.

The control element and the marker support are moreover movable in translation in four coplanar directions intermediate between the main axes from the neutral position towards a front-right position and towards a rear-left position and towards a front-left position and a rear-right position, the device being provided with a fourth binary active sensor. The four sensors and the markers are so arranged the ones relatively to the others that each of the nine positions, neutral, front, rear, right, left and intermediate as well as each of the two clockwise and anticlockwise rotations is individually identified by a four-digit binary signature emitted by the sensors.

More precisely, the marker support comprises a surface of revolution of normal axis, at the periphery of which the markers are arranged uniformly at a constant angular spacing. The neutral signature of the neutral position is emitted each time the marker support turns by the said angular spacing, and therefore the neutral signal of the neutral position is emitted a plurality of times per revolution of the marker support.

Following a rotation, the indexing and return means immobilises the marker support in a stable angular position identified by the neutral signature. The indexing and return means comprises a ring gear attached to the marker support and an indexer pressed against the ring by an elastic means, the indexer and the elastic means being kept attached to the case. The ring has as many teeth as the marker support has angular positions identified by the neutral signature. The ring is arranged on the support so that, when stationary, the indexer is pressed between two teeth of the ring stabilising the support in one of the stable angular positions identified by the neutral signature.

Three sensors can emit a total of eight different binary signatures and four sensors can emit sixteen different binary signatures. The binary signatures still available can advantageously be used to identify additional functions actuated by means of new displacements of the control element or of additional dedicated actuators.

In particular, the device can be provided with an ancillary control means activated by a pressure along the normal axis on the control element. This action can in particular be used to validate a function. The control element then translates from the neutral position towards a pressed position and actuates the ancillary control means which causes the sensors to switch. The sensors then emit a binary signal identifying the pressed position, the indexing and return means biasing the control element towards a return to the neutral position.

In a preferred embodiment, the sensors are optical sensors emitting and receiving a light ray. The part of the marker support arranged facing the sensors is a surface reflecting the light ray and the markers are non-reflective zones for example openings through which the light ray passes. A sensor emitting an incident light ray switches when on passage of a marker the light ray is no longer reflected to it. This arrangement of optical sensors has the advantage of not generating parasitic friction.

Lastly, the device is provided with guide means guiding the displacements of the control element in translation and in rotation.

BRIEF DESCRIPTION OF DRAWINGS

Other characteristics aims and advantages of the invention will become apparent on reading the following detailed description, with reference to the attached drawings, given by way of non-limiting example and in which.

Figure 1:
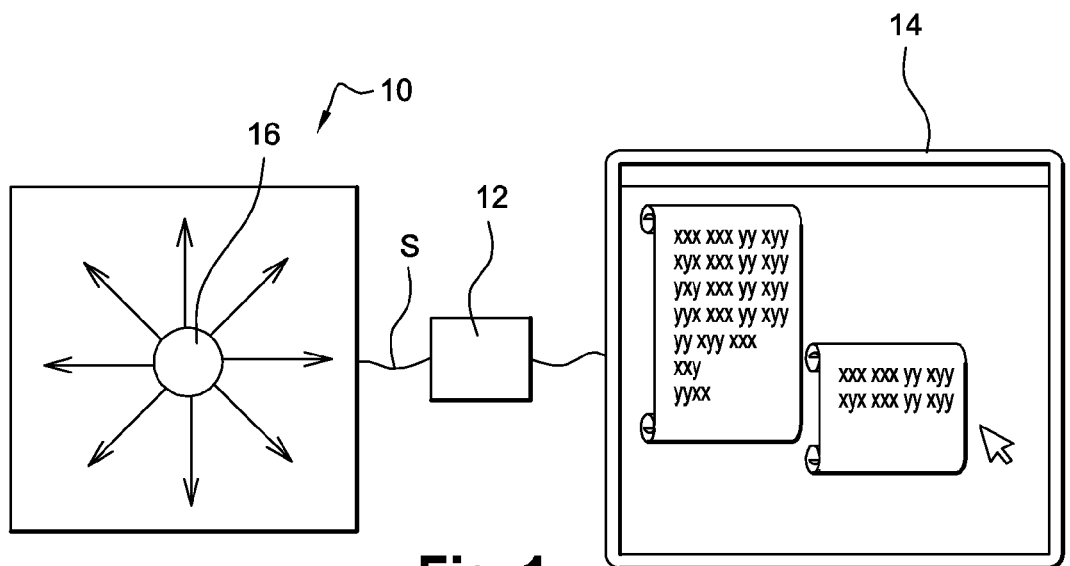
FIG. 1 is a block diagram of the connections between the device and its environment.
Figure 3:
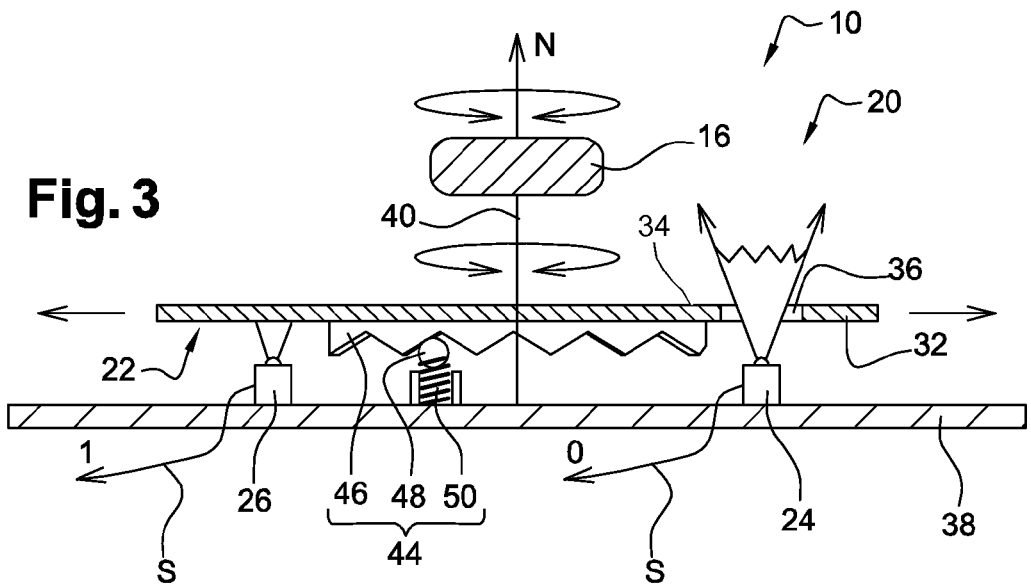
FIG. 3 is a cross-section of a detector of positions and displacements used in the device of FIGS. 1 and 2.
Figure 17:
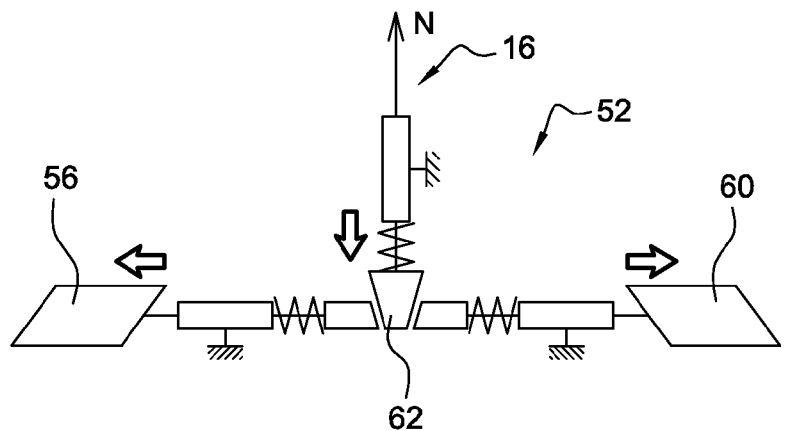
Figure 5:
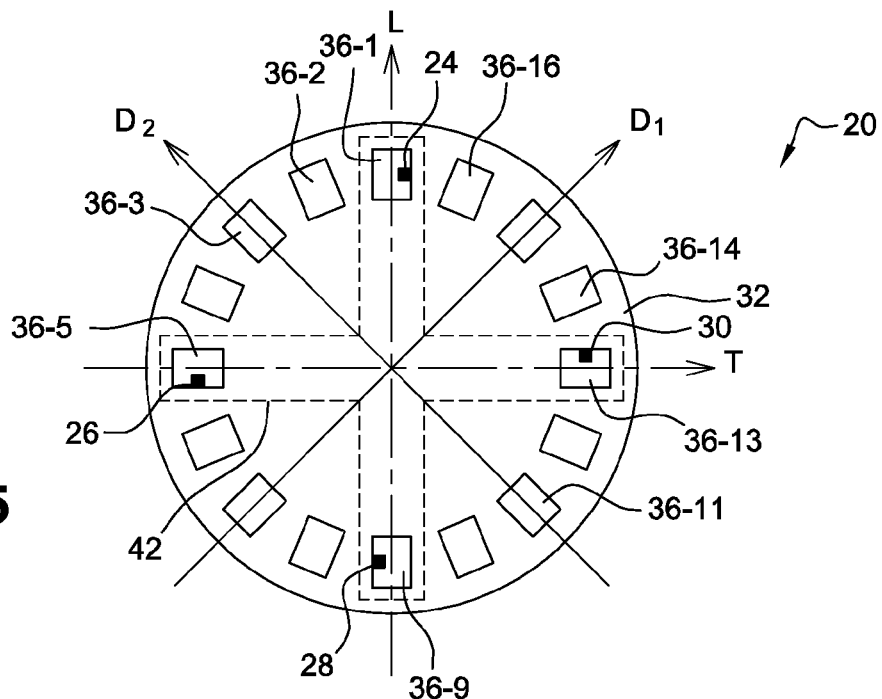
Figure 6:
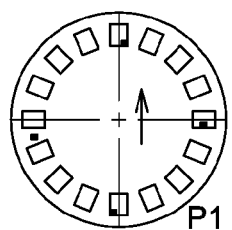
Figure 7:
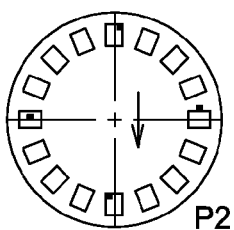
Figure 8:
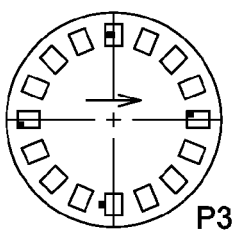
Figure 9:
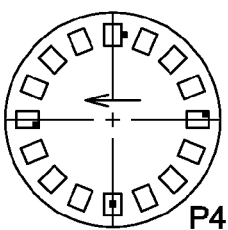
Figure 10:
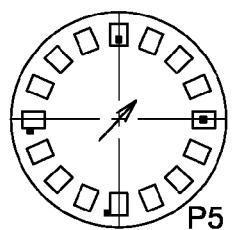
Figure 11:
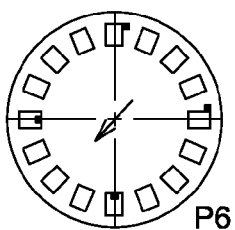
Figure 12:
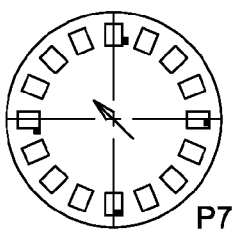
Figure 13:
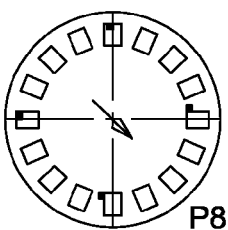
Figure 14:
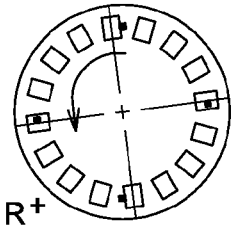
Figure 15:
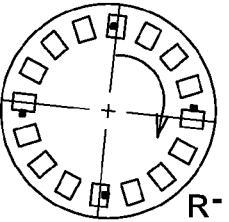
Figure 16:
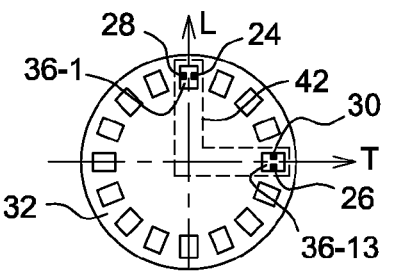

The sequence of FIGS. 5 to 15 shows the configuration of the detector of FIG. 3 depending on the positions and displacements achieved;

FIG. 16 is an alternative to the construction of FIG. 5;

FIG. 17 is a diagram of the construction of an ancillary means for validation of the device of FIG. 1;

FIG. 18 is a view from above of the detector of FIG. 5 fitted with the non-activated validation means of FIG. 17;

FIG. 19 is similar to FIG. 18 the validation means being activated;

FIG. 20 is a diagram of another embodiment of the detector of FIG. 5 integrating a validation means; and FIG. 21 shows a detector of position and of displacement constructed in accordance with a simplified embodiment.

DETAILED DESCRIPTION

In the remainder of the description identical or similar elements will be designated by the same references.

FIG. 1 shows a diagram of a control device 10 connected to a central unit 12 and to a monitor screen 14. The device 10 is provided with a control element 16 displaceable in a plurality of directions, identified by arrows, so as to generate and transmit signals S which can be interpreted by the central unit 12 to move a digital cursor towards one of the commands proposed on the screen 14 and then to validate this command.

Figure 2:
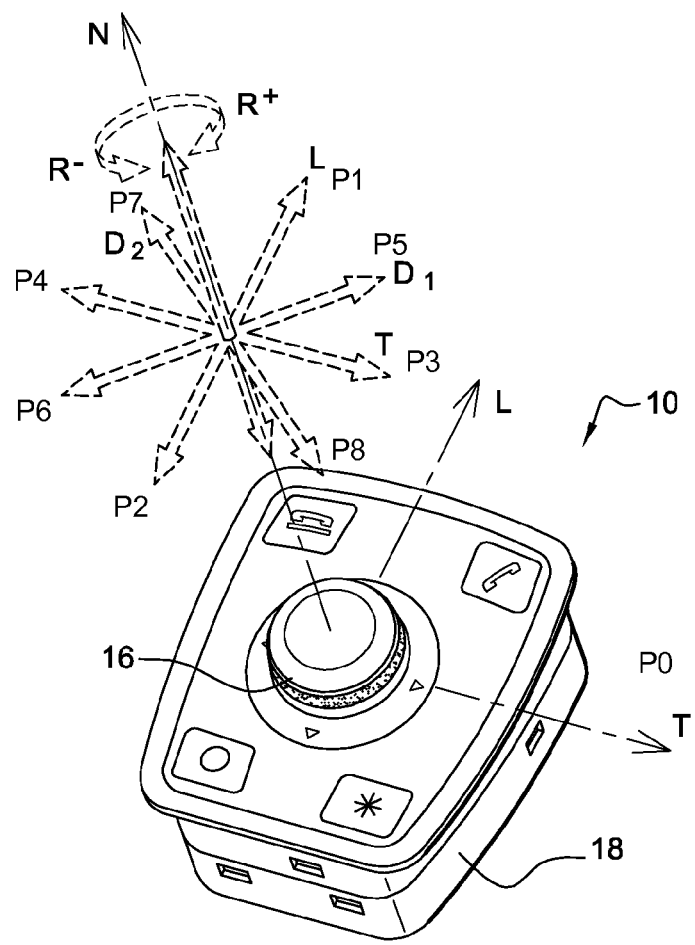
FIG. 2 is an isometric view of a control device formed in accordance with the invention.

In FIG. 2, the device 10 is identified in a direct Cartesian reference system TLN comprising the main transversal T and longitudinal L axes, and the normal axis N. The device 10 comprises a case 18 from the upper face of which emerges the control element 16. In this illustration, control buttons are arranged in the immediate vicinity of the control element 16 but other choices can be made and this example is not limiting to the invention. Similarly, a lever, ball or other control elements can be preferred to the knurled knob shown. Lastly the upper face of the case 18 is thus designated simply for convenience without any intention to limit the installation of the device 10 to any particular orientation.

In FIG. 2, the control element 16 is shown in a neutral position P0 situated at the origin of the TLN reference system. From this neutral position P0 it can be moved away in longitudinal translation L towards a front position P1 and towards a rear position P2, in transversal translation T towards a right position P3 and towards a left position P4 and, in diagonal translation, slantwise to the main axes T, L, along a first diagonal D1 towards a front-right position P5 and towards a rear-left position P6 and along a second diagonal D2 towards a front-left position P7 and towards a rear-right position P8. The control element 16 can moreover be turned about the normal axis N in the anticlockwise direction R+, positive direction of rotation, and in the clockwise direction R−, negative direction of rotation. Lastly, once the desired control has been reached, this can be validated by a simple pressure on the control element 16 which is depressed along a normal translation N towards a pressed position PV.

In a preferred embodiment, the translations of the control element 16 are independent of the two rotations R+, R−, which are only effected in the neutral position P0. Moreover, the translations, in the manner of the keys of a computer keyboard, are limited displacements of small amplitude, only a few millimeters. On the other hand the rotations R+, R−, can be unlimited.

In accordance with FIG. 3, the interpretable signals S are generated by a detector 20 of displacement linked to the control element 16. The detector 20 comprises binary active sensors 24, 26, which emit a signal and which switch on passage at their location of a passive marker 36 so as to emit another signal. For example, the optoelectronic sensors generate the signal "1" when emitting an incident light ray, a reflective surface 22 returns the reflected ray to them, and they switch and generate the signal "0" when they are facing a non-reflective mat surface, or facing an opening which allows the incident ray to pass. Other types of binary sensors exist such as magnets attracted by a metallic marker.

In accordance with a first embodiment, the detector 20 is provided with four optoelectronic binary sensors 24, 26, 28, 30 (FIG. 5), with a marker support 32 provided with a flat discal part 34 perpendicular to the normal axis N, and in which markers 36 have been made in the form of openings. These sensors 24-30 arranged on an electronic board 38 fixed in the case 18 emit a light ray towards the reflective surface 22 of the discal part 34 and switch from the signal 1 to the signal 0 on passage of an opening 36. An opposite construction in which the surface of the discal part is mat and the markers are reflective, the sensors then switching from 0 to 1 is a possible alternative.

The discal part 34 is connected to a shaft 40 extending along the normal axis N to outside the case 18 where the control element 16 is fixed to it, so that the control element 16 displaces in identical manner the support 32 and the markers 36 relatively to the sensors 24-30. Alternatively, the sensors 24-30 could be attached to the support 32, which would then become a sensor support, and the markers 36 attached to the case 18.

The device 10 is moreover provided with guiding means (not shown) guiding the translations and the rotations of the marker support 32, of the shaft 40 and of the control element 16.

Figure 4:
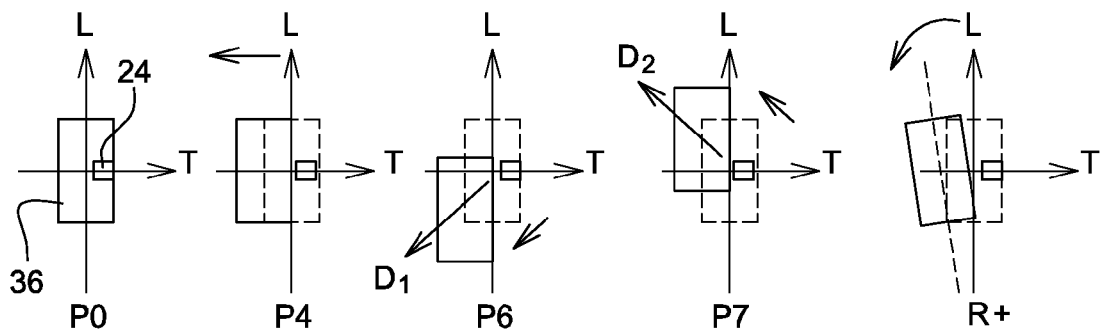
FIG. 4 is a diagram illustrating the displacements of a marker causing the switching of a sensor used in the detector of FIG. 3.

In this first embodiment, and with reference to FIG. 4, each marker 36 is a rectangular opening of length greater than the height of a sensor 24. FIG. 4 shows the significant displacements of the marker 36 relatively to the sensor 24. In the neutral position P0—on the left—the sensor 24 is facing the marker 36 in the immediate vicinity of the middle of the right side and it then emits a signal 0. From this position P0 each of the following four displacements moves the marker 36 away from the sensor 24 which then switches to the signal 1: the transversal translation T towards the left P4, the slantwise translation along the first diagonal D1 towards the rear-left P6, the slantwise translation along the second diagonal D2 towards the front-left P7, and the anticlockwise rotation R+. Many alternatives can be chosen for the shape of the marker, thus, rather than a rectangle, a plurality of small adjacent markers could be chosen each being specific to a particular displacement. What is essential is that a plurality of displacements of the marker support makes a same sensor switch.

The four sensors 24, 26, 28, 30 individually generate signals 0 or 1, which grouped together form a four-digit binary signature.

FIGS. 5 to 15 show the four fixed sensors 24-30 and the marker support 32 placed in different positions so that the sensors 24-30 on each occasion generate a four-digit binary signature specific to each of the positions of the support 32. Table 1 gives in summarised form the positions as well as the signatures specific to each of them.

In this embodiment, the first sensor 24 is placed at the front of the detector 20, the second sensor 26 is to the left, the third sensor 28 is to the rear and the fourth sensor 30 is to the right. The markers 36 number sixteen, referenced from 36-1 to 36-16, turning in the anticlockwise direction. They are equally spaced every 22.5° at the periphery of the support 32.

In the neutral position P0—FIG. 5—two longitudinal markers 36-1, 36-9, are aligned on the longitudinal axis L at the front 36-1 and at the rear 36-9 respectively and two transversal markers 36-5, 36-13, are aligned on the transversal axis T to the left 36-5 and to the right 36-13 respectively. The front sensor 24 is facing the front marker 36-1 and in the middle of its right side. The left sensor 26 is facing the left marker 36-5 and in the middle of its rear side. The rear sensor 28 is facing the rear marker 36-9 and in the middle of its left side. Lastly the right sensor 30 is facing the right marker 36-13 and in the middle of its front side. The four sensors being facing a marker, they all emit the signature 0000 which, in the example of construction selected is the neutral signature S0 identifying the neutral position P0.

The markers are arranged in an elementary pattern 42 repeated around the support 32. The elementary pattern 42 for the detector 20 of FIGS. 5-15, is a cross with four perpendicular arms formed of the two longitudinal markers 36-1, 36-9 and of the two transversal markers 36-5, 36-13. This cross pattern is reproduced every 22.5° so as to have sixteen markers 36 in all. Another angle of reproduction could have been selected, for example 10° and then thirty-six markers would be arranged on the support 32.

The markers and the sensors can be arranged the ones relatively to the others in accordance with very many alternatives. For example, in accordance with FIG. 16, the two longitudinal sensors 24, 28 are facing the front marker 36-1 on its right and left sides and the two transversal sensors 26, 30 are facing the right marker 36-13 on its front and rear sides. The elementary pattern 42 is then an L only comprising the two front 36-1 and right 36-13 markers.

In accordance with another embodiment not shown, the markers 36 are square and the four sensors 24-30 are arranged facing a same marker 36, each being in the middle of one of the sides of the marker 36.

In yet another embodiment not shown, the sensors are radially aligned and an undulated marker is so placed, in the neutral position, that the sensors are in the hollows of the undulations. A displacement of the marker then causes one or more sensors to switch, the elementary pattern 42 of the markers then being an undulated line. The man skilled in the art will know how to adjust the respective positions necessary to make the four-digit binary signature vary at each displacement.

Moreover, the binary four-digit signatures are arranged in the order in which the sensors are marked. In table 1 the signatures are ordered in the order of the sensors 24-26-28-30. A different order of the sensors would give different signatures.

The signatures S0-S8 corresponding to the positions P0-P8 respectively must be distinguished from the signatures SR+, SR− corresponding to the rotations R+, R−. Indeed, the signature of the positions obtained following a translation is specific to the position and not to the path leading to it. In a preferred embodiment, a passage from one position to another position is effected along a series of radial translations passing through the neutral position P0. For example the passage from the front position P1 to the right position P3 starts with a longitudinal translation to the neutral position P0 and then a transversal translation to the right position P3. In accordance with another embodiment, the passage from one position to another position can be effected along a direct translation between the two peripheral positions. The passage from the front position P1 to the right position P3 then follows a single translation parallel with the second diagonal D2 directly from the front position P1 to the right position P3. Whatever the path followed, radial translations or direct translation, the central unit 12 will interpret the signals emitted as being those of the positions of the control element 16.

Conversely, a rotation R+, R− will cause a succession of signatures in an ordered series. In accordance with FIGS. 5, 14 and 15, a positive rotation R+ on leaving the neutral position P0 will generate a series of binary four-digit signatures such as 0000/1010/0101 and then again 0000 when the marker support 32 has turned by 22.5°. The central unit 12 interprets this ordered series as signifying a positive rotation R+. Similarly a negative rotation R− on leaving the neutral position P0 will generate the opposite series of signatures 0000/0101/1010 and then again 0000 . . . . The central unit 12 then interprets this opposite ordered series as signifying a negative rotation R−.

Moreover, the central unit 12 considers that the detected rotation is continuing while the signatures change in the order of the series.

Another possible interpretation is that the central unit 12 only considers the first change of signature 0000/1010, S0/SR+ for a positive rotation R+ and 0000/0101, S0/SR− for a negative rotation R−. Once this first change has been marked, the central unit 12 no longer observes the exact signatures but only the change of signatures and, while the signature varies, then the central unit 12 considers that the rotation corresponding to the first change observed is in progress.

Whatever the embodiment selected, the rotation signifies a succession of signatures corresponding to the passage of the elementary patterns 42 of markers 36 before the sensors 24-30.

In a preferred embodiment, the rotation of the control element 16 can only occur in the neutral position P0. The neutral signature S0 of the neutral position P0 is therefore emitted a plurality of times per revolution of the support 32, sixteen times for the embodiment of FIGS. 5-15. In addition, the neutral signature S0 is always the starting point of the series of signatures signifying a rotation. In another embodiment, the control element 16 can turn, R+, R−, while it is already in a position distant from the neutral position P0, for example in the front position P1. In this case, the central unit 12 must be able to recognise a rotation R+, R− while observing another ordered series or another change of signature.

In the preferred embodiment, at the end of a rotation, the marker support 32 is immobilised in a position identified by the neutral signature S0. For this purpose, the device 10 is provided with an indexing and return means 44 of the marker support 32 towards a stable position identified by the neutral signature S0. The indexing means 44 shown in FIG. 3 comprises a ring gear 46 attached to the support 32 against which a ball 48 is permanently biased by a spring 50 attached to the case 18. On a rotation R+, R−, the ball 48 travels along the toothed path and, at the end of the rotation, the ball 48 pressed between two teeth immobilises the ring 46, and therefore the marker support 32, in a stable position corresponding to a position identified by the neutral signature S0. Many alternatives exist to construct this type of indexing means.

Moreover, when following a translation, the support 32 has been moved away from the neutral position P0 the return means 44 must bias it towards a return to the neutral position P0. The means 44 then comprises another elastic means (not shown) which biases the support 32 radially towards the neutral position P0.

The device 10 can in addition be provided with a validation means 52 a first embodiment of which is shown in FIGS. 17, 18 and 19. While the marker support 32 is in the neutral position P0, the validation means 52 has the purpose of making the sensors 24-30 switch from the neutral signature S0 to a validation signature SV different from all the binary four-digit signatures already used. Thus the user, after having selected the required function can validate it by actuating the means 52. The validation of a function is one of the possible alternatives to the use of the means 52 which could also be used to scroll the available applications on the screen passing for example from the radio to the screen for management of the air-conditioning, to the GPS etc. . . . .

In the embodiment shown in FIGS. 17, 18 and 19, the neutral signature S0 is 0000 and the validation signature SV is 1111. This switching is effected by simultaneously placing facing each of the four sensors 24, 26, 28, 30 a reflective screen 54, 56, 58, 60 causing all the sensors to switch at the same time from the signal 0 to the signal 1. The reflective screens 54-60 are normally in a rest position—FIG. 18—in the proximity of the shaft 40. By pressing on the control element 16 along the normal axis N—FIG. 17—a wedge 62 moves the reflective screens 54-60 radially and simultaneously away so that they are arranged level with the sensors 24-30. Springs radially return the reflective screens 54-60 into the rest position as soon as the normal pressure N ceases. The validation means 52 thus formed is attached to the longitudinal L and transversal T translations of the marker support 32. Conversely it does not turn and always remains orientated along these two main axes T, L.

Another embodiment of the validation means 52 is outlined in FIG. 20. In this other embodiment, the marker support 32 is conical and the sensors 24-30 emit an inclined light ray perpendicular to the cone. On the left of FIG. 20 the ray passes through the marker and the sensor sends a signal 0. A translation of the support 32 towards the right—FIG. 20 center—or a pressure along the normal axis N—FIG. 20 right—displaces the marker causing the sensor to switch to the signal 1.

The device 10 described uses twelve binary four-digit signatures listed in Table 1.

TABLE 1

| FIGS. | Positions | References of the positions | Signature | References of the signatures |
|---|---|---|---|---|
| 5 | Neutral | P0 | 0000 | S0 |
| 6 | Front | P1 | 0100 | S1 |
| 7 | Rear | P2 | 0001 | S2 |
| 8 | Right | P3 | 0010 | S3 |
| 9 | Left | P4 | 1000 | S4 |
| 10 | front-right | P5 | 0110 | S5 |
| 11 | rear-left | P6 | 1001 | S6 |
| 12 | front-left | P7 | 1100 | S7 |
| 13 | rear-right | P8 | 0011 | S8 |
| 14 | anticlockwise rotation | R+ | 1010 | SR+ |
| 15 | clockwise rotation | R− | 0101 | SR− |
| 19 | Validation | PV | 1111 | SV |

Four binary four-digit signatures therefore remain available. In the example selected above and summarised in Table 1 these unused signatures are 0111, 1011, 1101 and 1110. The device 10 can then be formed in accordance with an augmented embodiment using the sixteen binary signatures actuating four additional functionalities.

The four additional functionalities can be new displacements, for example, rather than a single intermediate translation, D1, D2, between each main direction T, L, it is conceivable that the control element 16 is displaced along two intermediate translations for example orientated every 30°.

It may also be conceived that in one direction, for example longitudinal L towards the front, rather than having a single front position P1 the control element could be displaced towards a first front position and then still more towards the front, to a second front position.

Alternatively the four signatures still available can be used to actuate functions via dedicated ancillary means displacing additional reflective screens or markers causing the sensors to switch. These ancillary means can for example be control buttons peripheral to the control element 16.

Also, the four available signatures can be used to actuate functions via a combination of displacements such as a rotation and a translation, or a longitudinal translation L and a normal translation N.

The device 10 can also be formed in accordance with the simplified embodiment with three binary sensors therefore able to emit only eight binary three-digit signatures. This embodiment is particularly suited to a device 10 of which the control element 16 can only be displaced from a neutral position along four translations along the longitudinal L and transversal T axes, two rotations R+, R− about the normal axis N and a validation by pressure along the normal axis N, without the possibility of diagonal displacement D1, D2. FIG. 21 proposes a marker support 32 placed in a neutral position P0 and each displacement of which is identifiable by a binary three-digit signature given in Table 2 below.

TABLE 2

| Positions | Reference of the positions | Signatures |
|---|---|---|
| neutral | P0 | 000 |
| front | P1 | 011 |
| rear | P2 | 100 |
| right | P3 | 101 |

TABLE 2-continued

| Positions | Reference of the positions | Signatures |
|---|---|---|
| left | P4 | 010 |
| anticlockwise rotation | R+ | 001 |
| clockwise rotation | R− | 110 |
| validation | PV | 111 |

The invention claimed is:

1. A control device for selecting functions in a vehicle, said device comprising:

three sensors wherein each of the three sensors output a binary signal and are arranged on an electronic board fixed in a case, the three sensors switching in response to passage of passive markers arranged on a support displaceable by means of a manipulable control element, the support being displaceable in translation along a longitudinal axis towards a front position and a rear position and perpendicularly along a transversal axis towards a right position and a left position, wherein the longitudinal axis and second transversal axis form main axes and, displaceable in rotation about a normal axis perpendicular to the main axes in a clockwise direction and in an anticlockwise direction, wherein the marker support and the control element are connected to an indexing and return means which biases the marker support and the control element towards a neutral position, the three sensors and the markers being arranged such that each of the neutral position, the front position, the rear position, the right position, the left position, as well as rotation in each of the clockwise direction and anticlockwise direction is individually identified by a three-digit binary signature emitted by the three sensors, wherein the marker support comprises a surface of revolution that rotates about the normal axis, at the periphery of which the markers are arranged uniformly at a constant angular spacing so that a neutral signature that indicates that the control element is at the neutral position is emitted each time the marker support turns by an angle corresponding to the angle of constant angular spacing, whereby the neutral signature is emitted a plurality of times per revolution of the marker support and in which, following a rotation, the indexing and return means urges the marker support toward a stable angular position identified by the neutral signature.

2. The device as described in claim 1, wherein the control element and the marker support are moreover movable in translation in four coplanar directions intermediate between the main axes from the neutral position towards a front-right position, a rear-left position, a front-left position, and a rear-right position, wherein the device includes a fourth sensor that outputs a binary signal and cooperates with the three sensors to form four sensors, wherein the four sensors and the markers are arranged such that each of the neutral position, the front position, the rear position, the right position, the left position, the front-right position, the rear-left position, the front-left position, the rear-right position, as well as rotation in each of the clockwise direction and the anticlockwise direction is individually identified by a four-digit binary signature emitted by the four sensors.

3. The device as described in claim 1, wherein the indexing and return means comprises a ring gear attached to the marker support and an indexer pressed against the ring by an elastic means, the indexer and the elastic means being kept attached to the case, the ring having as many teeth as the marker support has angular positions identified by the neutral signal, the ring being so arranged on the support that when stationary the indexer is pressed between two teeth of the ring stabilizing the support in one of the stable angular positions identified by the neutral signal.

4. The device as described in claim 1, wherein the binary signatures still available are used to identify additional functions actuated by means of new displacements of the control element or additional dedicated actuators.

5. The device as described in claim 4 provided in addition with an ancillary control means activated by a pressure along the normal axis on the control element causing it to translate from the neutral position towards a pressed position and causing the sensors to switch so that they emit a binary signal identifying the pressed position, the indexing and return means biasing the control element towards a return to the neutral position.

6. The device as described in claim 1, wherein the sensors are optical sensors emitting and receiving a light ray and in which the part of the marker support arranged facing the sensors is a surface reflecting the light ray and the markers are non-reflective zones so that, a sensor emitting an incident light ray switches when on passage of a marker the light ray is no longer reflected to it.

7. The device as described in claim 1, wherein the device includes guiding means guiding the displacements of the control element in translation and in rotation.

* * * * *